(12) United States Patent
Jansson (10) Patent No.: US 8,922,406 B2
(45) Date of Patent: Dec. 30, 2014

(54) ADC CALIBRATION

(75) Inventor: Christer Jansson, Linköping (SE)

(73) Assignee: Anacatum Design AB, Linköping (SE)

( * ) Notice: Subject to any disclaimer, the term of this patent is extended or adjusted under 35 U.S.C. 154(b) by 0 days.

(21) Appl. No.: 14/118,412

(22) PCT Filed: Mar. 16, 2012

(86) PCT No.: PCT/EP2012/054685
§ 371 (c)(1),
(2), (4) Date: Nov. 20, 2013

(87) PCT Pub. No.: WO2012/123578
PCT Pub. Date: Sep. 20, 2012

(65) Prior Publication Data
US 2014/0070970 A1 Mar. 13, 2014

Related U.S. Application Data

(60) Provisional application No. 61/453,630, filed on Mar. 17, 2011.

(51) Int. Cl.
*H03M 1/10* (2006.01)
*H03M 1/06* (2006.01)
*H03M 1/46* (2006.01)

(52) U.S. Cl.
CPC .......... *H03M 1/1009* (2013.01); *H03M 1/1057* (2013.01); *H03M 1/0692* (2013.01); *H03M 1/468* (2013.01)
USPC .......................................... 341/120; 341/155

(58) Field of Classification Search
CPC . H03M 1/1009; H03M 1/1057; H03M 1/468; H03M 1/1092
USPC ................... 341/155, 120, 118, 161
See application file for complete search history.

(56) References Cited

U.S. PATENT DOCUMENTS

| 4,970,514 A | 11/1990 | Draxelmayr |
| 5,644,308 A * | 7/1997 | Kerth et al. ................... 341/120 |
| 7,046,178 B2 | 5/2006 | Draxelmayr |
| 2010/0079325 A1 | 4/2010 | Berens et al. |

FOREIGN PATENT DOCUMENTS

| DE | 10314189 A1 | 10/2004 |
| EP | 0320642 A1 | 6/1989 |

OTHER PUBLICATIONS

Z. Boyacigiller et al., "An Error-Correcting 14b/20 μs CMOS A/D Converter," 1981 IEEE International Solid-State Circuits Conference, Digest of Technical Papers, vol. XXIV, Jan. 1, 1981, pp. 62-63.

* cited by examiner

*Primary Examiner* — Peguy Jean Pierre
(74) *Attorney, Agent, or Firm* — Capitol City TechLaw (57) ABSTRACT

A method of determining at least one calibration value for a redundant analog-to-digital-converter, ADC, is disclosed. For at least an i:th bit bL, the corresponding bit weight $w_i$ is less than the sum of the bit weights $W_j$, $j=0, 1, \ldots, i-1$ corresponding to the bits $b_j$, $j=0, 1, \ldots, i-1$ with lesser significance than the bit bi. The method comprises sampling a first electrical value representative of the bit weight $w_i$; performing a first analog-to-digital, A/D, conversion using the bits $b_j$, $j=0, 1, \ldots, i-1$ with lesser significance than the bit $b_i$ to obtain a first digital word of said bits $b_j$, $j=0, 1, \ldots, i-1$ with lesser significance than the bit $b_i$ representing said first electrical value; and estimating the value of the bit weight $W_i$ expressed in terms of the bit weights Wj. $j=0, 1, \ldots, i-1$ corresponding to the bits $b_j$, $j=0, 1, \ldots, i-1$ with lesser significance than the bit $b_i$ based at least on said first digital word, wherein the resulting estimated value of the bit weight $w_i$ is one of the at least one calibration value. A control unit, a redundant ADC and a computer program are also disclosed.

20 Claims, 9 Drawing Sheets

ADC CALIBRATION

TECHNICAL FIELD

The present invention relates to calibration of analog to digital converters.

BACKGROUND

An analog-to-digital converter (ADC) is an interface circuit between the analog domain and the digital domain which is used for converting an analog signal to a corresponding digital representation. ADCs are used in many types of applications, such as but not limited to audio applications, video applications, measurement applications, and radio applications, wherein such conversion between analog and digital representation is required.

Many applications set relatively hard requirements on linearity and resolution of the ADC, which may be hard to meet, at least without resulting in undesirably large circuit area and/or power consumption.

SUMMARY

According to a first aspect, there is provided a method of determining at least one calibration value for a redundant analog-to-digital-converter (ADC), wherein, for at least an i:th bit $b_i$, the corresponding bit weight $w_i$ is less than the sum of the bit weights $w_j$, $j=0, 1, \ldots, i-1$ corresponding to the bits $b_j$, $j=0, 1, \ldots, i-1$ with lesser significance than the bit $b_i$. The method comprises sampling a first electrical value representative of the bit weight $w_i$. Furthermore, the method comprises performing a first analog-to-digital (A/D) conversion using the bits $b_j$, $j=0, 1, \ldots, i-1$ with lesser significance than the bit $b_i$ to obtain a first digital word of said bits $b_j$, $j=0$, $1, \ldots, i-1$ with lesser significance than the bit $b_i$ representing said first electrical value. Moreover, the method comprises estimating the value of the bit weight $w_i$ expressed in terms of the bit weights $w_j$, $j=0, 1, \ldots, i-1$ corresponding to the bits $b_j$, $j=0, 1, \ldots, i-1$ with lesser significance than the bit $b_i$ based at least on said first digital word, wherein the resulting estimated value of the bit weight $w_i$ is one of the at least one calibration value.

The method may further comprise sampling a second electrical value representative of the sum of one or more bit weights $w_k$ corresponding to one or more bits $b_k$ with lesser significance than the bit $b_i$. Furthermore, the method may comprise performing a second A/D conversion using the bits $b_j$, $j=0, 1, \ldots, i-1$ with lesser significance than the bit $b_i$ to obtain a second digital word of said bits $b_j$, $j=0, 1, \ldots, i-1$ with lesser significance than the bit $b_i$ representing said second electrical value. Estimating the value of the bit weight $w_i$, expressed in terms of the bit weights $w_j$, $j=0, 1, \ldots, i-1$ corresponding to the bits $b_j$, $j=0, 1, \ldots, i-1$ with lesser significance than the bit $b_i$ may comprise estimating said value of the bit weight $w_i$ based on the first and the second digital word.

Performing the first and the second A/D conversion may comprise performing a first level shift with a first amount and a second level shift with a second amount, respectively, for ensuring that the electrical value to be converted is in a conversion range corresponding to the bits $b_j$, $j=0, 1, \ldots, i-1$ with lesser significance than the bit $b_i$ even in the presence of an offset. The first amount may be equal, or substantially equal, to the second amount. The first and second amount may correspond to approximately half the bit weight $w_i$.

The method may further comprise estimating a value of an offset of the ADC based on the first and the second digital word. The estimated value of the offset may be one of said at least one calibration value.

According to a second aspect, there is provided a method of calibrating a redundant ADC, wherein, for at least an i:th bit $b_i$, the corresponding bit weight $w_i$ is less than the sum of the bit weights $w_j$, $j=0, 1, \ldots, i-1$ corresponding to the bits $b_j$, $j=0, 1, \ldots, i-1$ with lesser significance than the bit $b_i$. The method comprises, for each of one or more such bits $b_i$:

a) performing the method according to the first aspect for estimating the value of the bit weight $w_i$ expressed in terms of the bit weights $w_j$, $j=0, 1, \ldots, i-1$ corresponding to the bits $b_j$, $j=0, 1, \ldots, i-1$ with lesser significance than the bit $b_i$; and b) storing said at least one or more calibration values, resulting from step a) in a memory.

According to a third aspect, there is provided a method of error correction in a redundant ADC, wherein, for at least an i:th bit $b_i$, the corresponding bit weight $w_i$ is less than the sum of the bit weights $w_j$, $j=0, 1, \ldots, i-1$ corresponding to the bits $b_j$, $j=0, 1, \ldots, i-1$ with lesser significance than the bit $b_i$. The method comprises calibrating the ADC using the method according to the second aspect. The method further comprises, during operation of the ADC for A/D conversion of an analog input signal of the ADC, utilizing the stored one or more calibration values for determining an error-corrected output signal of the ADC.

According to a fourth aspect, there is provided a control unit for a redundant ADC, wherein, for at least an i:th bit $b_i$, the corresponding bit weight $w_i$ is less than the sum of the bit weights $w_j$, $j=0, 1, \ldots, i-1$ corresponding to the bits $b_j$, $j=0, 1, \ldots, i-1$ with lesser significance than the bit $b_i$. The control unit is configured to control the execution of the method according to any of the first, second, or third aspects.

According to a fifth aspect, there is provided a redundant ADC, wherein, for at least an i:th bit $b_i$, the corresponding bit weight $w_i$ is less than the sum of the bit weights $w_j$, $j=0, 1, \ldots, i-1$ corresponding to the bits $b_j$, $j=0, 1, \ldots, i-1$ with lesser significance than the bit $b_i$. The redundant ADC comprises a control unit according to the fourth aspect.

In any of the first to fifth aspect above, the redundant ADC may be e.g. a successive approximation ADC or a pipeline ADC, but is not limited thereto.

According to a sixth aspect, there is provided a computer program product comprising computer program code means for executing the method according to any of the first, second, or third aspects in the redundant ADC when said computer program code means are run by a programmable control unit of the redundant ADC.

According to a seventh aspect, there is provided a computer readable medium having stored thereon a computer program product comprising computer program code means for executing the method according to any of the first, second, or third aspects in the redundant ADC when said computer program code means are run by a programmable control unit of the redundant ADC.

An advantage of some embodiments of the present invention is that accuracy requirements on analog components of an ADC can be relaxed by means of digital post processing. Thereby, an ADC with relatively high linearity is facilitated with relatively inaccurate components (e.g. matching requirement on components such as capacitors may be relatively low), which in turn facilitates a relatively small circuit area for these components. Furthermore, these advantages may be attained at a relatively small overhead cost for the components used for performing the methods.

Further embodiments of the invention are defined in the dependent claims.

It should be emphasized that the term "comprises/comprising" when used in this specification is taken to specify, the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which.

DETAILED DESCRIPTION

Design Example, SA ADC

Embodiments of the present invention concern calibration and error correction of redundant analog-to-digital converters ADCs. In this section, some design guidelines are presented for an example of such a redundant ADC, namely a version of a so called successive-approximation (SA) ADC. An SA ADC is sometimes also referred to as a SAR ADC, where SAR stands for successive approximation register.

In an SA ADC, an analog input value is sampled and subsequently compared with a number of reference levels using a binary search type algorithm. An example of such an algorithm is given in the following: In a first comparison cycle, a most significant bit (MSB) in a successive approximation register (SAR) of the SA ADC is set to '1' and the bits with lesser significance than the MSB are set to '0'. The analog input value is compared with an analog reference value corresponding to the word in the SAR. If the analog input value is higher than the reference value, the MSB in the SAR is set to '1' in the remaining comparison cycles. Otherwise, the MSB in the SAR is set to '0' in the remaining comparison cycles. In a second comparison cycle, obit with the second highest significance (MSB−1) in the SAR is set to '1' and the bits with lesser significance than the (MSB−1) are set to '0'. The analog input value is compared with an analog reference value corresponding to the word in the SAR. If the analog input value is higher than the reference value, the (MSB−1) in the SAR is set to '1' in the remaining comparison cycles. Otherwise, the (MSB−1) in the SAR is set to '0' in the remaining comparison cycles. In a third comparison cycle, a bit with the third highest significance (MSB−2) in the SAR is set to '1' and the bits with lesser significance than the (MSB−2) are set to '0'. The analog input value is compared with an analog reference value corresponding to the word in the SAR. If the analog input value is higher than the reference value, the (MSB−2) in the SAR is set to '1' in the remaining comparison cycles. Otherwise, the (MSB−2) in the SAR is set to '0' in the remaining comparison cycles. This process is continued until all the bits in the SAR has been determined, and at the end of the last comparison cycle, a digital output word of the SA ADC, corresponding to the analog input value, is present in the SAR.

Figure 1:
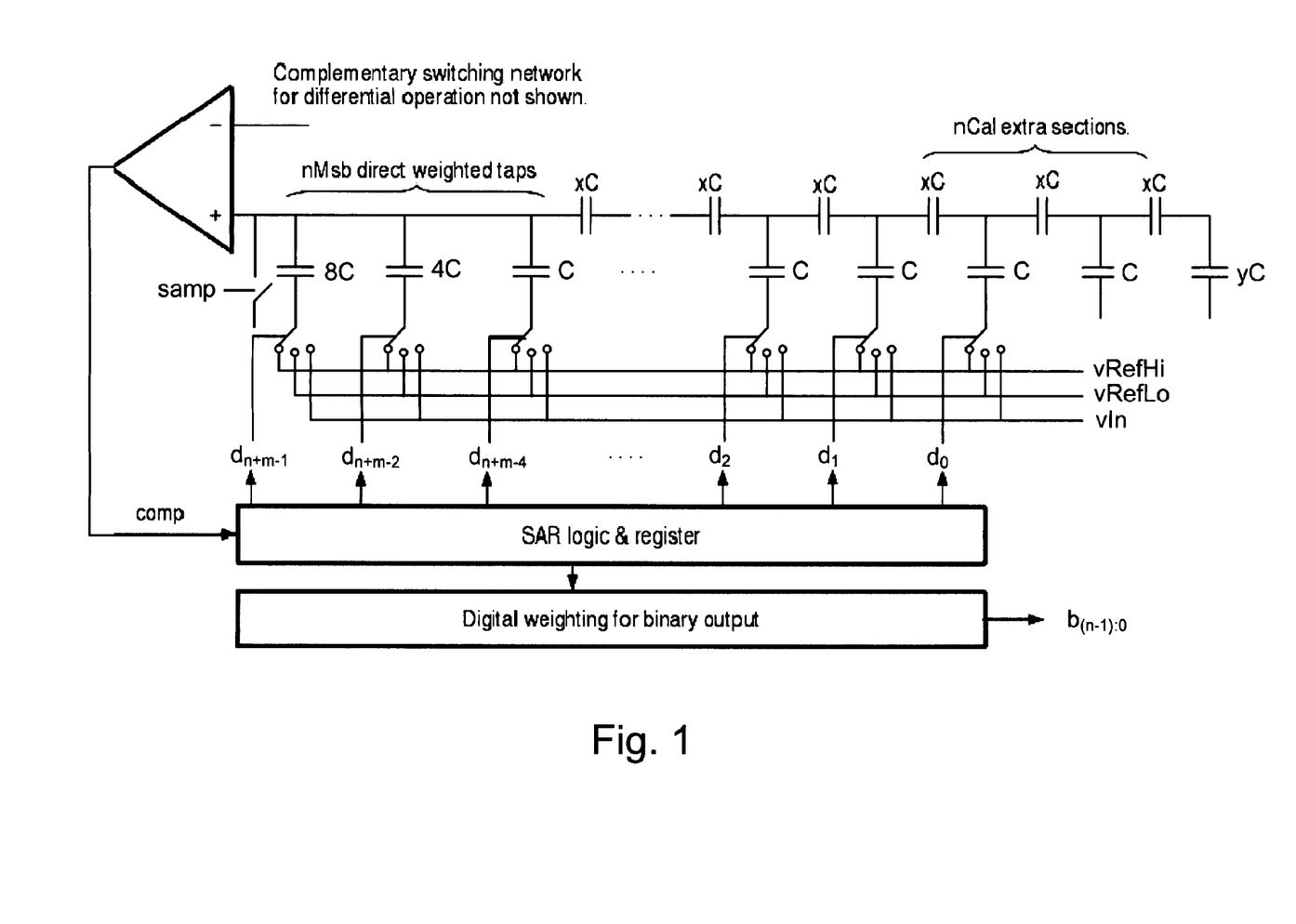
FIG. 1 is a schematic diagram of an ADC.

FIG. 1 is a schematic circuit diagram of an embodiment of an SA ADC. As can be seen from FIG. 1, this embodiment has a combination of directly weighted most significant bits with capacitor size (here binary weighted, but other weightings may be used as well) and C-xC links for the less significant bits. This structure has the advantages of combining:

Relatively small capacitor ratios:
Relatively fast charge distribution in the capacitive network due to relatively small resistances.
Operation of switches at only two reference levels that can be chosen for high gate-to-source voltage giving a relatively low Ron.
Relatively low capacitive load on reference buffers as the combination of directly weighted MSBs allow reasonable small capacitor units in C-xC links.
Relatively short logic depth from comparator output to reference switches giving relatively small logic delays in a time critical loop.

All together this opens up for an ADC implementation with relatively high speed and relatively low power consumption.

The SA ADC of illustrated in FIG. 1 may be operated as follows for converting an input voltage (vIn in FIG. 1) to a digital word representing said input voltage. During sampling of the input voltage, the switch controlled by the signal samp (in the following denoted sampling switch) is closed. As shown in FIG. 1, one end of the sampling switch is connected to an input terminal of a comparator circuit. The other end of the sampling switch is connected to anode that functions as a source for electrical charge, such as to a voltage source generating a suitable common-mode voltage (in the following referred to as vInCm) for the comparator (this is not explicitly shown in FIG. 1). Thus, when the sampling switch is closed, electrical charge may be transferred to or from the node connected to said input terminal of the comparator. Furthermore, during sampling of the input voltage, the other switches (in the following referred to as control switches) are connected to the input voltage vIn. Thereby, the charge (in the following referred to as qIn) in the node connected to said input terminal of the comparator is (ideally) proportional to the difference vIn−vInCm, and thus represents the input voltage vIn. The proportionality factor depends on the capacitance values for the capacitors. As an alternative to connecting all control switches to vIn during the sampling phase, only some control switches may be connected to vIn, whereas the other control switches may be connected to some reference voltage, such as vInCm. A gain of the ADC, which is proportional to the aforementioned proportionality factor, depends on which switches (or, equivalently, which capacitors) are configured to be connected to vIn and which are configured to be connected to the reference voltage during the sampling phase. This configuration, determining the gain of the ADC, may in some embodiments be set to a fixed configuration during design and/or manufacturing. Alternatively, the configuration may, in some embodiments, be a variable configuration such that the gain of the ADC may be varied during operation of the ADC. At the end of the sampling phase, the sampling switch is opened, whereby no electrical charge can be transferred to or from the node connected to said input terminal of the comparator. Thus, during a comparison phase, following after the sampling phase, the charge qIn is preserved and held constant. In the comparison phase, the control switches are controlled by the bits $d_{n+m-1}$ (i.e. MSB), $d_{n+m-2}$ (i.e. MSB−1), ..., $d_0$ (i.e. LSB) in the SAR according to the binary search algorithm described above. If a bit in the SAR is '1', the corresponding switch is connected to a high reference voltage vRefHi (which could e.g. be a supply voltage of the ADC). On the other hand, if a bit in the SAR is '0', the corresponding switch is connected to a low reference voltage vRefLo<RefHi (vRefLo could e.g. be a ground potential of the ADC). SA A/D conversion is well known to persons in the field of A/D conversion, and the operation of the SA ADC in FIG. 1 during normal SA A/D conversion is not described in any further detail herein.

Figure 2:
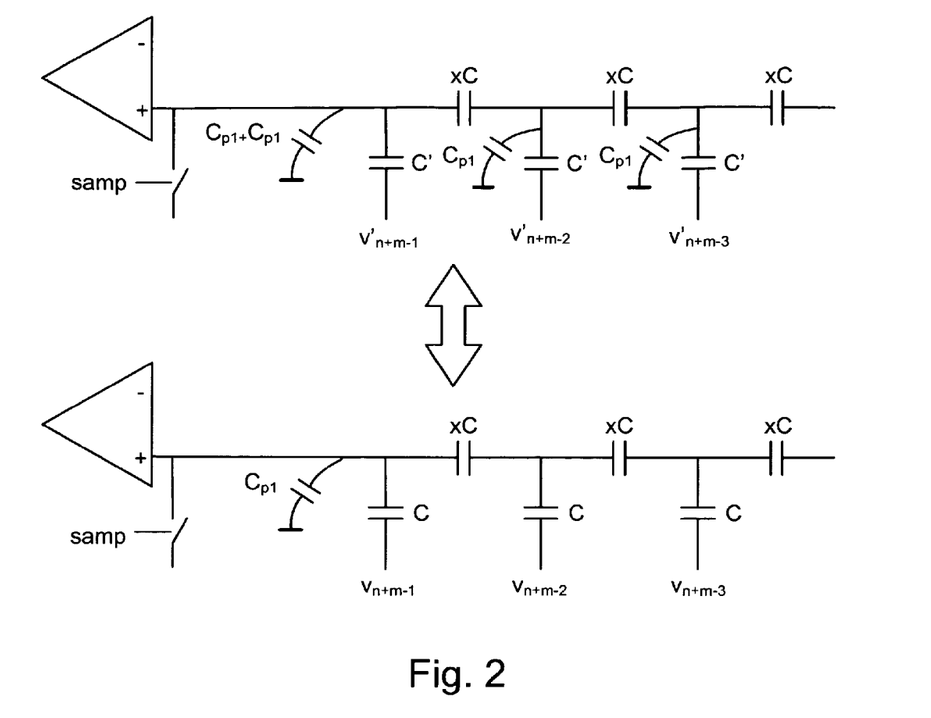
FIG. 2 illustrates parasitic capacitance in an ADC.

However, due to the influence of parasitic capacitors in the xC capacitors the ratio xC/C is hard to predict accurately as these parasitics are not that well defined. The transformation due to influence of the xC capacitor parasitic $C_p$ of a network using real C' capacitors to the actual $v'_i$ voltages into an effective network is given in FIG. 2, with corresponding values C and $v_i$, respectively. The relation between these values are:

$$C = C' + c_p \qquad \text{Eq. 1}$$

$$v_i = \frac{C'}{C' + c_p} \cdot v'_i$$

Thus the parasitics change the ratio between the capacitors in the link and with an uncertainty that is too large for any thing but low resolution converters. But the ratios will be relatively (or even very) stable over time, so if these ratios or rather the weights between taps in the network can be established in an accurate manner, then the actual weight of each comparator decision $d_i$ can be accounted for in the digital domain. Then the binary words, b(N−1):0 that corresponds to the successive approximated input values are formed by summing the weight of all the positive comparator decisions. For this successive approximation to be possible to do for all input values within input range, the value of x must at least be equal to two when all uncertainties have been accounted for.

In practice, a value of x that is guaranteed to be even some what larger than two is desired. Then, redundancy can be built in so that small errors from insufficient settling and erroneous comparator decisions can be recovered from. The redundancy coming from that x is larger than two makes it necessary to use m extra approximation steps to the n steps otherwise needed for a final n-bit resolution.

Figure 3:
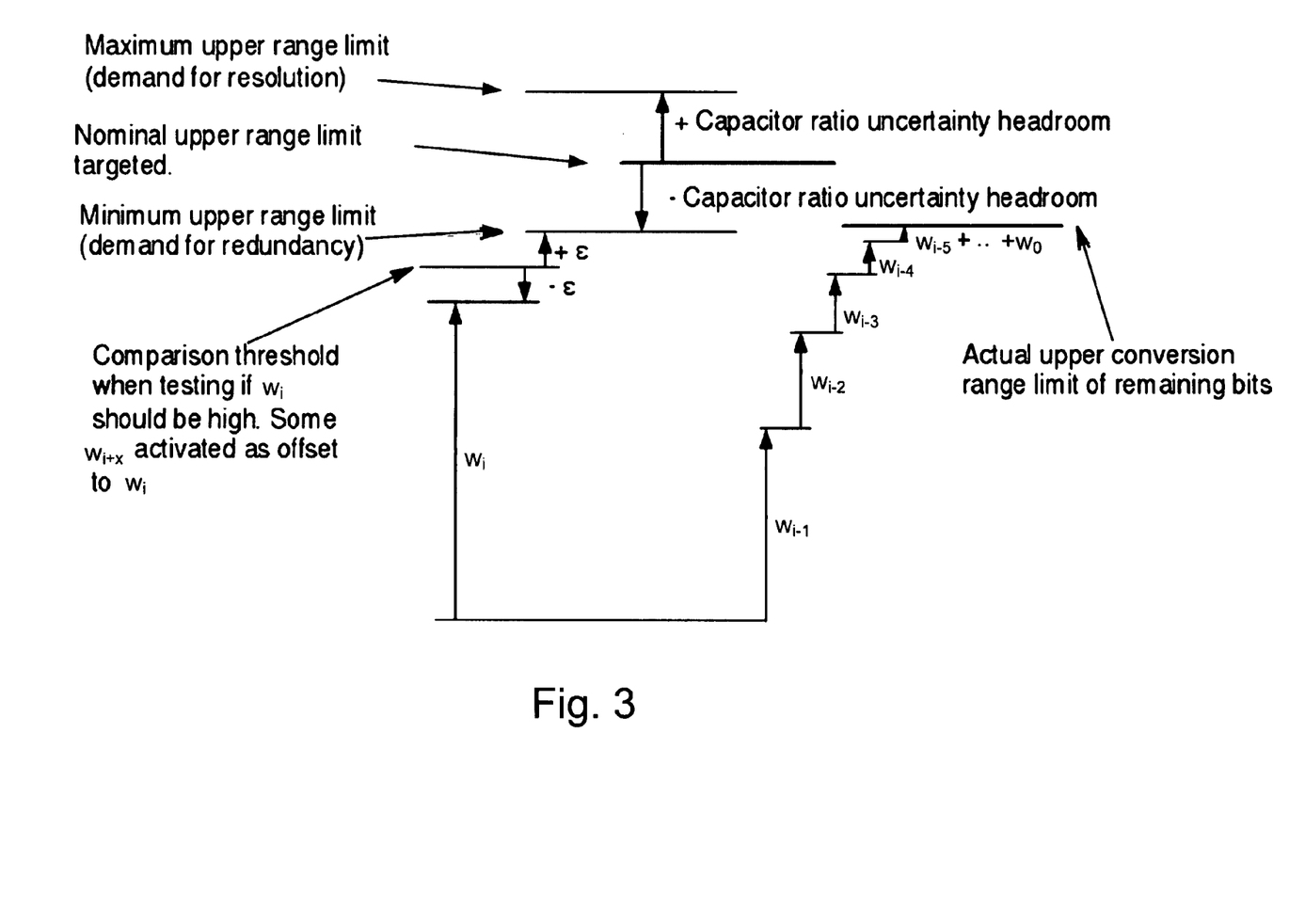
FIG. 3 illustrates redundancy.

For tolerance to settling and comparator errors we now define that we need a redundancy of $\pm\epsilon$ of the remaining conversion range (in the following analysis it is assumed that we are in the LSB link structure). The concept of margins for redundancies is schematically illustrated in FIG. 3.

Define $r_{lsb}$ as:

$$r_{lsb} = \frac{w_i}{w_{i-1}}, i \in [n+m-nMsb, 0] \qquad \text{Eq. 2}$$

where $r_{lsb}$ is the ratio between a bit weight to next less significant bit weight and for now we assume that this ratio is constant between bits. The redundancy at any point is the sum of weights of the remaining less significant bits that exceeds the weight, $w_i$, of the bit under conversion (the bit set high) minus the LSB weight (quantization step). Thus the redundancy is:

$$\text{redundancy} = \sum_{j=1}^{i} \frac{w_i}{r_{lsb}^j} - (w_i - w_0) \qquad \text{Eq. 3}$$

wherein the indexing starts at 0 with the LSB. Also using:

$$w_0 = \frac{w_i}{r_{lsb}^i} \qquad \text{Eq. 4}$$

and calculating the sum gives:

$$\text{redundancy} = \frac{2 - r_{lsb}}{r_{lsb} - 1} \cdot \left(1 - \frac{1}{r_{lsb}^i}\right) \cdot w_i \qquad \text{Eq. 5}$$

As a check, $r_{lsb}$ equal to two gives the redundancy equal to zero as expected. With the two $\epsilon$ relative redundancy needed earlier we get:

$$w_i \cdot 2 \cdot \varepsilon \geq \frac{2 - r_{lsb}}{r_{lsb} - 1} \cdot \left(1 - \frac{1}{r_{lsb}^i}\right) \cdot w_i \qquad \text{Eq. 6}$$

Rearranging and assuming the term $r_{lsb}^i$ small in the context:

$$r_{lsb} \leq \frac{2 + 2\varepsilon}{1 + 2\varepsilon} = r_{max} \qquad \text{Eq. 7}$$

Thus we have found the largest acceptable ratio between weights. Next we need to find the smallest ratio which is set by the resolution needed in the approximation steps available. In an n-bit binary weighted converter the ratio between MSB and LSB is:

$$\frac{MSB}{LSB} = 2^{n-1} \qquad \text{Eq. 8}$$

This ratio will be used as the minimum allowed ratio as a good approximation of n-bit resolution for this non-binary weighted converter too. For generality, define $r_{msb}$ as the ratio between the nMSB first direct weighted taps:

$$r_{msb} = \frac{w_i}{w_{i-1}}, i \in [n+m-1, n+m-(nMsb-1)] \qquad \text{Eq. 9}$$

The relation between MSB and LSB will then be:

$$MSB = r_{msb}^{(nMsb-1)} \cdot r_{lsb}^{(n+m-nMsb)} \cdot LSB \qquad \text{Eq. 10}$$

Putting in the requirement between MSB and LSB gives:

$$2^{n-1} \leq r_{msb}^{(nMsb-1)} \cdot r_{lsb}^{(n+m-nMsb)} \qquad \text{Eq. 11}$$

or $$r_{lsb} \geq (2^{n-1} \cdot r_{msb}^{(1-nMsb)})^{1/(n+m-nMsb)} = r_{min} \qquad \text{Eq. 12}$$

The nominal $r_{lsb}$ to design for is then:

$$r_{lsb} \geq (2^{n-1} \cdot r_{msb}^{(1-nMsb)})^{1/(n+m-nMsb)} = r_{min} \qquad \text{Eq. 13}$$

which gives the most headroom for capacitor ratio spread while ensuring redundancy and resolution. As a nonlimiting example, using the numbers $\epsilon=0.05$, m=2, n=12 and $r_{msb}=2$ gives:

$r_{min}=1.741$ $r_{max}=1.909$ $r_{nom}=1.825$     Eq. 14

Figure 4:
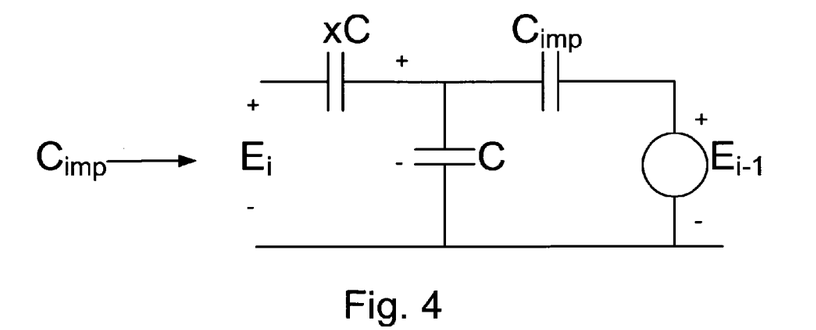
FIG. 4 illustrates a calculation model for determining nominal capacitor ratios.

Consider FIG. 4 for the calculation of the ratio x from the redundancy requirement. It can be recognized that the weight ratio $r_{lsb}$ relates to $E_i$ and $E_{i-1}$ as:

$$r_{lsb} = \frac{E_{i-1}}{E_i} = \frac{C_{imp} + C}{C_{imp}} \qquad \text{Eq. 15}$$

since this is the attenuation per link. For calculation of the attenuation the capacitance loading between stages, $C_{imp}$, needs to be found first. $C_{imp}$ can be found by knowing that it is also the capacitance seen when looking into the link so that:

$$C_{imp} = \frac{xC \cdot (C + C_{imp})}{xC + C + C_{imp}} \qquad \text{Eq. 16}$$

Solving this equation for $C_{imp}$ yields:

$$C_{imp} = \frac{1}{2} \cdot \left( \sqrt{(4x+1)} - 1 \right) \cdot C \qquad \text{Eq. 17}$$

Putting Eq 17 into Eq 15 and solving for x gives the sought result:

$$x = \frac{1}{4} \cdot \left[ \left( 1 + \frac{2}{r_{lsb} - 1} \right)^2 - 1 \right] \qquad \text{Eq. 18}$$

Using the previously calculated example value of $r_{lsb}=1.825$ will give x=2.681. Note that this is the effective (nominal) design target values. The designed capacitors must be adjusted for the parasitics according to Eq 1. Furthermore, it should be noted that, due to manufacturing process variations etc, the actual fabricated capacitor values will deviate from such nominal values. The compensation of such deviations from nominal values is a goal of some embodiments of the present invention presented in the following.

Embodiments of the Invention:

Embodiments of the present invention are described in this section. Although some embodiments are described in the context of an SA ADC of the type shown in FIG. 1, the application of embodiments of the present invention is not limited to such an ADC, but may be applied to any suitable type of redundant ADC. For example, embodiments of the present invention may be applied to an SA ADC of the type illustrated in FIG. 1, but modified either such that all bits are directly weighted (in a similar fashion as the MSBs in FIG. 1) or such that none of the bits are directly weighted, but instead C-xC links are utilized for all bits. Furthermore, embodiments of the present invention may be applied to so called pipeline ADCs (where a certain degree of redundancy in the form of a range overlap between successive pipeline stages is typically utilized). Other suitable types of redundant ADCs may be considered as well.

As previously mentioned the capacitor ratios in the switching network is hard to predict accurately due to parasitics and mismatch but the values will be quite stable over time. So we need to find out the analog weight of each SAR bit in the network. The basic idea is to measure the analog weight of each bit expressed in the analog weights of its less significant bits. Thereby the relation between all SAR bit weights can be derived. This relation is then directly used to weight the individual bits from the SAR register delivered by the comparison process to sum up to a digital output word from the ADC that corresponds linearly to the sampled and converted analog input. The digital output can then, for example, be further scaled so that the range after offset error correction is 0 to $2^{N-1}$.

Define the weight of each binary bit i as $w_i$. The relation between bit weights can be expressed as:

$w_i = w_{i-1} \cdot r_i$     Eq. 19

For some, say L, least significant bits, the mismatch between the bit weights is typically so small that we do not need to resolve the small individual spread between the bit weight ratios coming from process mismatch. Therefore, according to embodiments of the present invention, it is assumed that:

$r_i = r, i \in [1, L-1]$     Eq. 20

Measuring the analog weights as a function of each other will give an expression as:

$$w_i = \sum_{j=0}^{i-1} a_{ij} \cdot w_j \qquad \text{Eq. 21}$$

where $a_{i,j}$ will be functions of the comparator decisions (0 or 1) made in the measurement series for bit i. To characterize the L least significant bits we can e.g. solve:

$$r^{L-1} \cdot w_0 = \sum_{j=0}^{L-2} a_{ij} \cdot r^j \cdot w_0 \qquad \text{Eq. 22}$$

This equation can be hard to solve analytically but is readily solved by a numerical approach using successive approximation. Start by assuming max and min ranges of r, for example, $1.5 < r \leq 2$. Then, try r equal to mid range by calculating left and right hand side of the equations and compare the sides. If left side is larger then r is too large and so max range is set to the just tried value and if right hand side is larger min range is set to the just tried value. This process is then iterated until the resolution desired. The number of iterations needed will linearly depend on L.

$w_i$ can now be calculated as:

$w_i = r^i \cdot w_0, i \in [0, L-1]$     Eq. 23

For remaining bits (i>L-1) we will trivially find the weights $w_i$ from:

$$w_i = \sum_{j=0}^{i-1} a_{ij} \cdot w_j \qquad \text{Eq. 24}$$

Next section describes how the $a_{ij}$ values may be computed.

Figure 5:
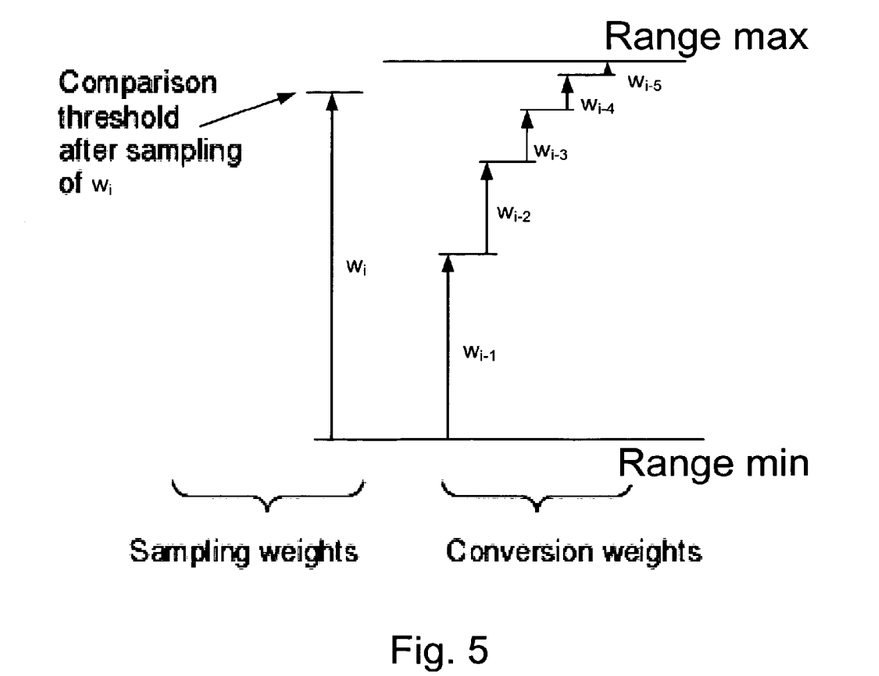
FIGS. 5-8 illustrate bit-weight estimation according to various embodiments.

Without comparator and sampling offsets, or with only negligible offsets, the finding of the $a_{ij}$ values can be performed as follows. Just sample bit weight $w_i$ (or, in other terms, an electrical value representative of the bit weight $w_i$) and convert the sampled value by bit weights i−1 to 0 by the normal SA A/D conversion process. In FIG. 5 it is shown how the sampled bit weight corresponds to the range of the remaining bits. Using a proper weighting, with r<2, the sampled bit weight falls safely within the range of the remaining bits. With reference to FIG. 1, the sampling of (an electrical value representative of) the bit weight $w_i$ can be performed by connecting the corresponding control switch to vRefHi and the other control switches to vRefLo while closing the sampling switch. Thereby, an electrical charge (which is an electrical value) representative of the bit weight $w_i$ is accumulated in the node connected to the input terminal of the comparator. By opening the sampling switch, said electrical charge is held in said node.

Figure 6:
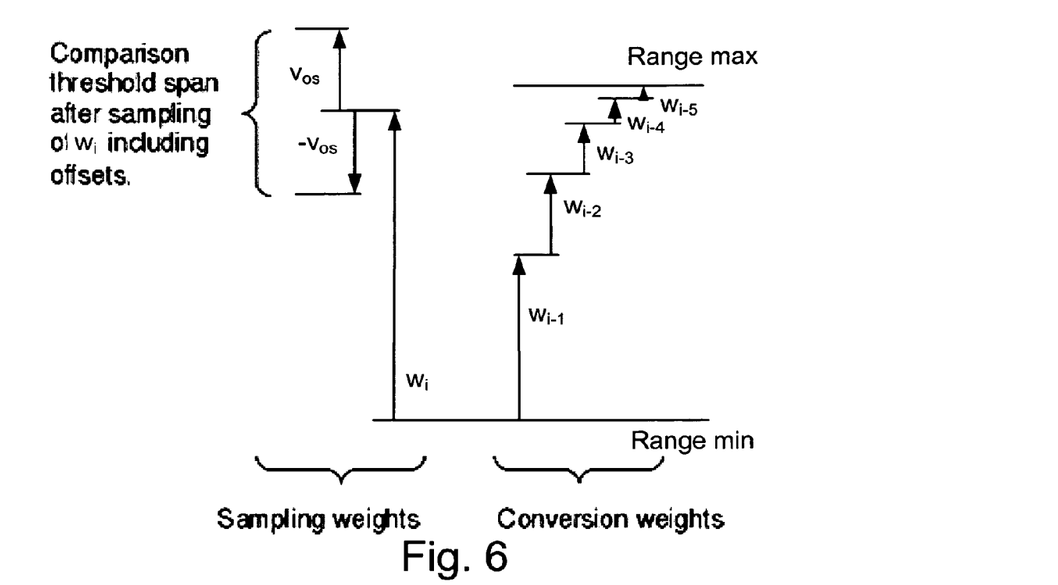
Figure 7:
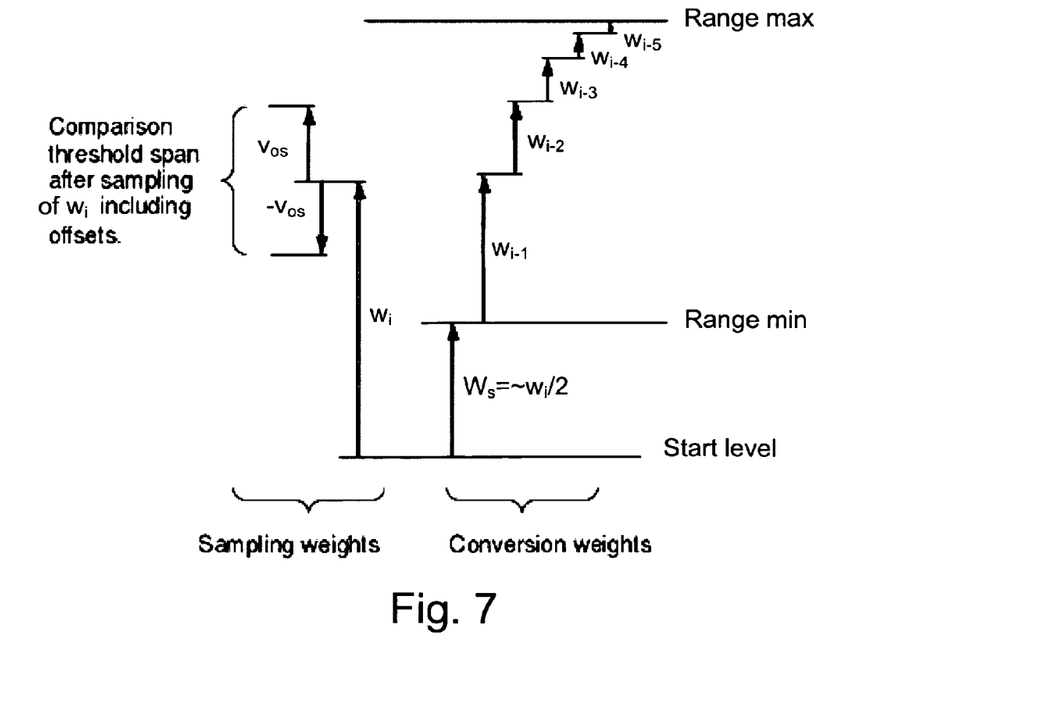

However, if (non negligible) offsets are included, the situation changes as seen in FIG. 6, as even relatively small offsets can take the conversion out of range. The bit weights are from now on represented in units of volts at comparator input. To improve the situation, the conversion range may be shifted towards a centering of the conversion range around the sampled $w_i$ level. This can be accomplished by forcing an add of a weight $w_s$ which may be around half of the $w_i$ level in to the conversion as seen in FIG. 7. Practically this may be done by utilizing the differential structure so that the two capacitors corresponding to $w_i$ are both connected to a common-mode reference voltage, denoted vRefCm, instead of the differentially negative reference voltage during conversion process. As the bit weight estimation is a differential process the level of vRefCm does not matter but for the sake of controlling comparator input common mode level the vRefCm should be near the common mode level of the differential reference voltages.

Making a conversion of the sampled $w_i$ with addition of $w_s$ as in FIG. 7, where $b_{ij}$ is the comparator decision for bit j, will give that:

$$w_i + v_{os} = w_s + \sum_{j=0}^{i-1} b_{ij} \cdot w_j \quad \text{Eq. 25}$$

Figure 8:
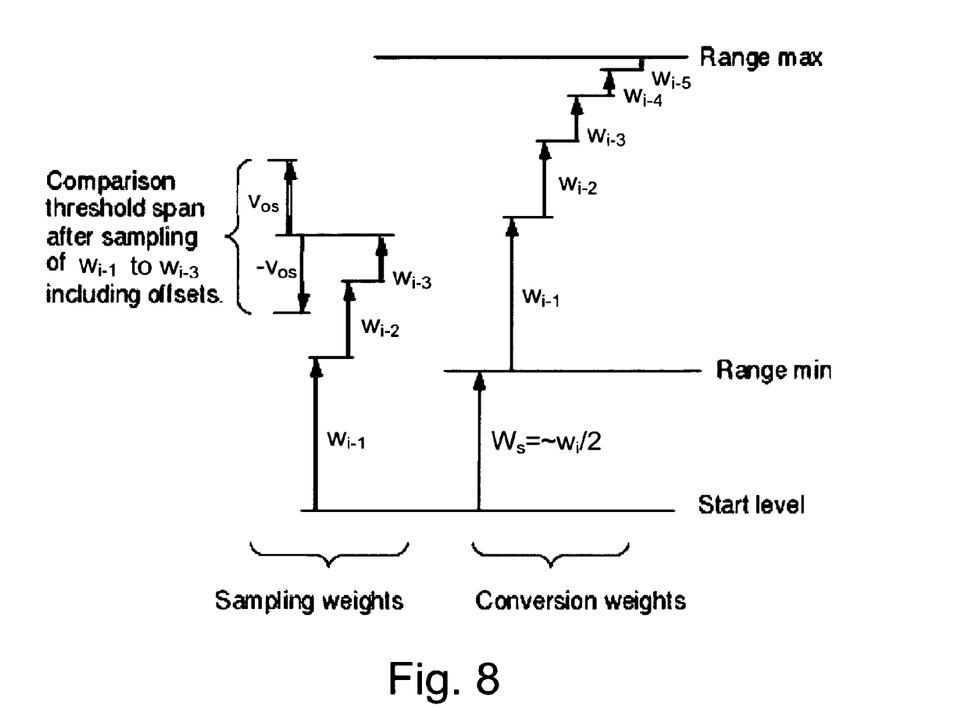

Now we are better in range but have the influence of offset. To be able to remove the offset, we need to do an additional reference measurement as visualized in FIG. 8. The reference measurement is created by sampling (an electrical value representative of) the sum of a number of bit weights $w_k$ corresponding to one or more bits $b_k$ with lesser significance than the bit $b_i$ (i.e. each with a weight lesser than $w_i$). In this case, as an example, we use the next three less significant bits and corresponding weights, but these bits/weights may be chosen based on the (qualitative) criteria that the sum of their expected weight should be near $w_i$. With a designed ratio of $r_{nom}=1.825$ from the example above, the sum of the weights of the next three bits are only 1.3% higher than $w_i$, which is relatively close for this purpose. In this case the reference sampling yields:

$$w_{i-1} + w_{i-2} + w_{i-3} + v_{os} = w_s + \sum_{j=0}^{i-1} c_{ij} \cdot w_j \quad \text{Eq. 26}$$

where, $c_{ij}$ is the comparator decision for bit j when referencing weight i. Subtracting Eq. 26 from Eq. 25 and rearranging gives:

$$w_i = \sum_{j=0}^{i-1} b_{ij} \cdot w_j - \sum_{j=0}^{i-1} c_{ij} \cdot w_j + w_{i-1} + w_{i-2} + w_{i-3} \quad \text{Eq. 27}$$

which can be written as:

$$w_i = \sum_{j=0}^{i-1} a_{ij} \cdot w_j \quad \text{Eq. 28}$$

where $$a_{ij} = b_{ij} - c_{ij}, \quad i \in [0, i-4] \quad \text{Eq. 29}$$
$$a_{ij} = b_{ij} - c_{ij} + 1, \quad i \in [i-3, i-1]$$

which is the desired format to calculate the bit weights according to Eq. 21 and Eq. 24

Again with reference to FIG. 1, the sampling of (an electrical value representative of) the sum of said bit weights $w_k$ can be performed by connecting the corresponding control switches to vRefHi and the other control switches to vRefLo while closing the sampling switch. Thereby, an electrical charge (which is an electrical value) representative of the sum of said bit weights $w_k$ is accumulated in the node connected to the input terminal of the comparator. By opening the sampling switch, said electrical charge is held in said node.

Figure 9:
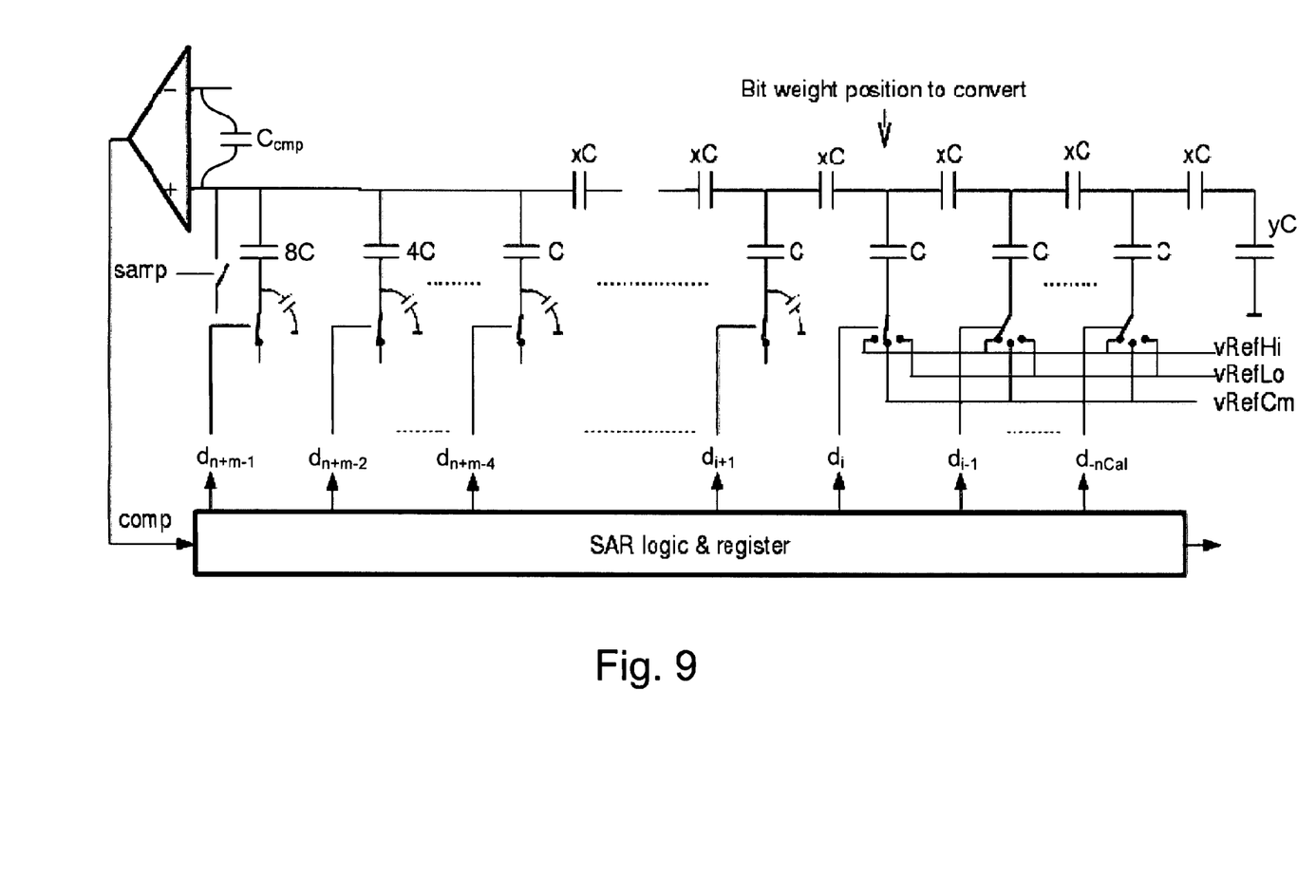
FIGS. 9-10 illustrate floating capacitors during bit-weight estimation.

Without taking any actions the ranges in FIGS. 7 and 8 become smaller when approaching the lesser significant, bits and the offsets might become larger than the available range even though ranges are well centered. A method to maintain a higher range is to let the more significant taps/capacitors that are not used during the weight estimation to be floating, as illustrated in FIG. 9. Regardless of if these capacitors are tied to a fix potential or being purely floating, except for ground plate parasitics that are "tied" to ground, these capacitors do not change the ratios that we are looking for as they only will damp both the signal and the conversion range by the same amount as seen the comparator. Left floating, this damping is however reduced considerably, making the influence of comparator offset and noise less significant.

Figure 10:
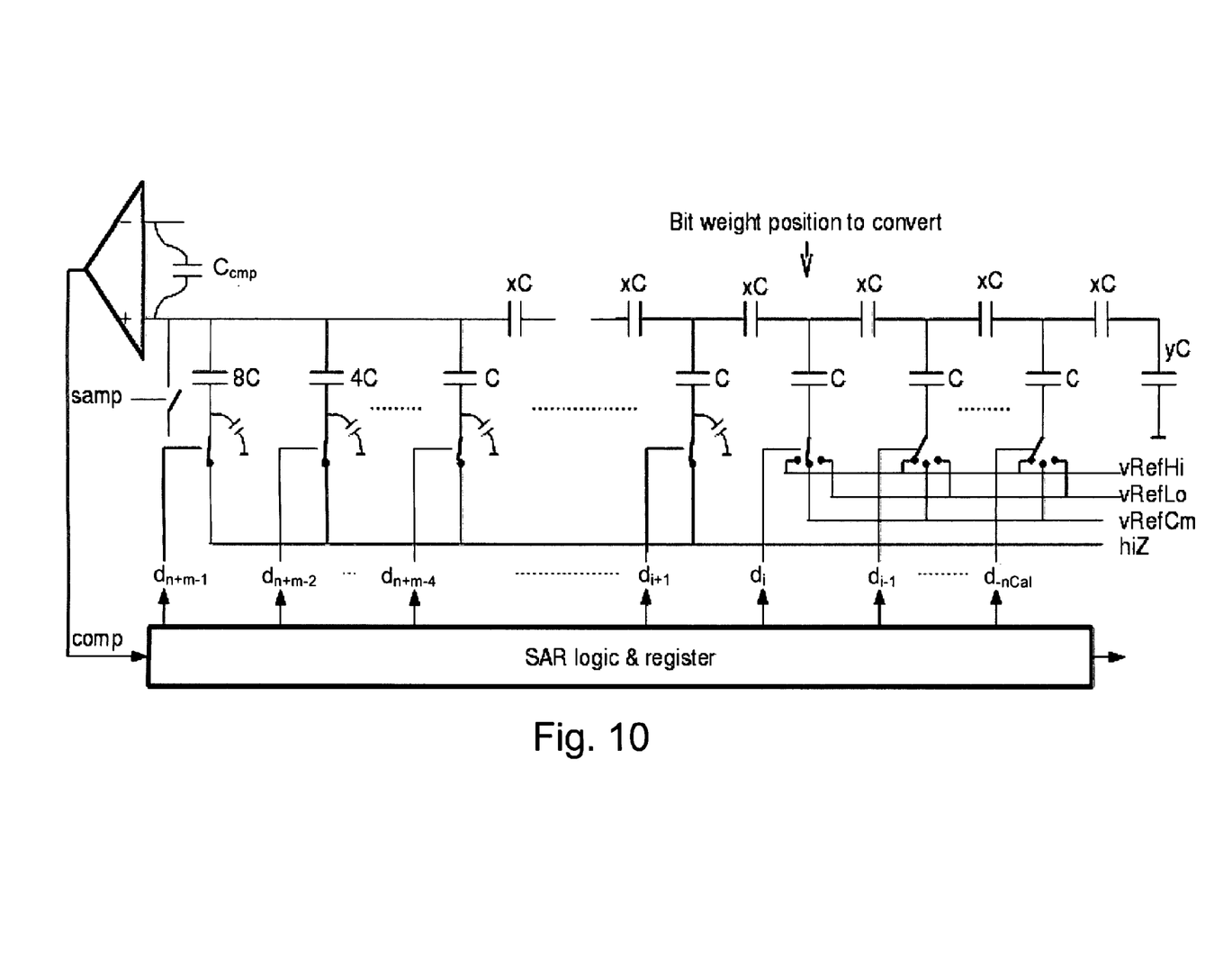

A further step is to connect all the floating capacitors on each differential side to the same node as shown in FIG. 10, where this node is denoted hiZ. This helps to improve the coupling of the less significant capacitors to the comparator as the series xC capacitors becomes bypassed to a large extent. A long chain of series xC capacitors might become harmful in combination with the capacitance of bottom plate parasitics of the floating capacitors and the input capacitance of the comparator which may actually be quite significant even compared to the capacitance of the driven capacitor net.

Figure 11:
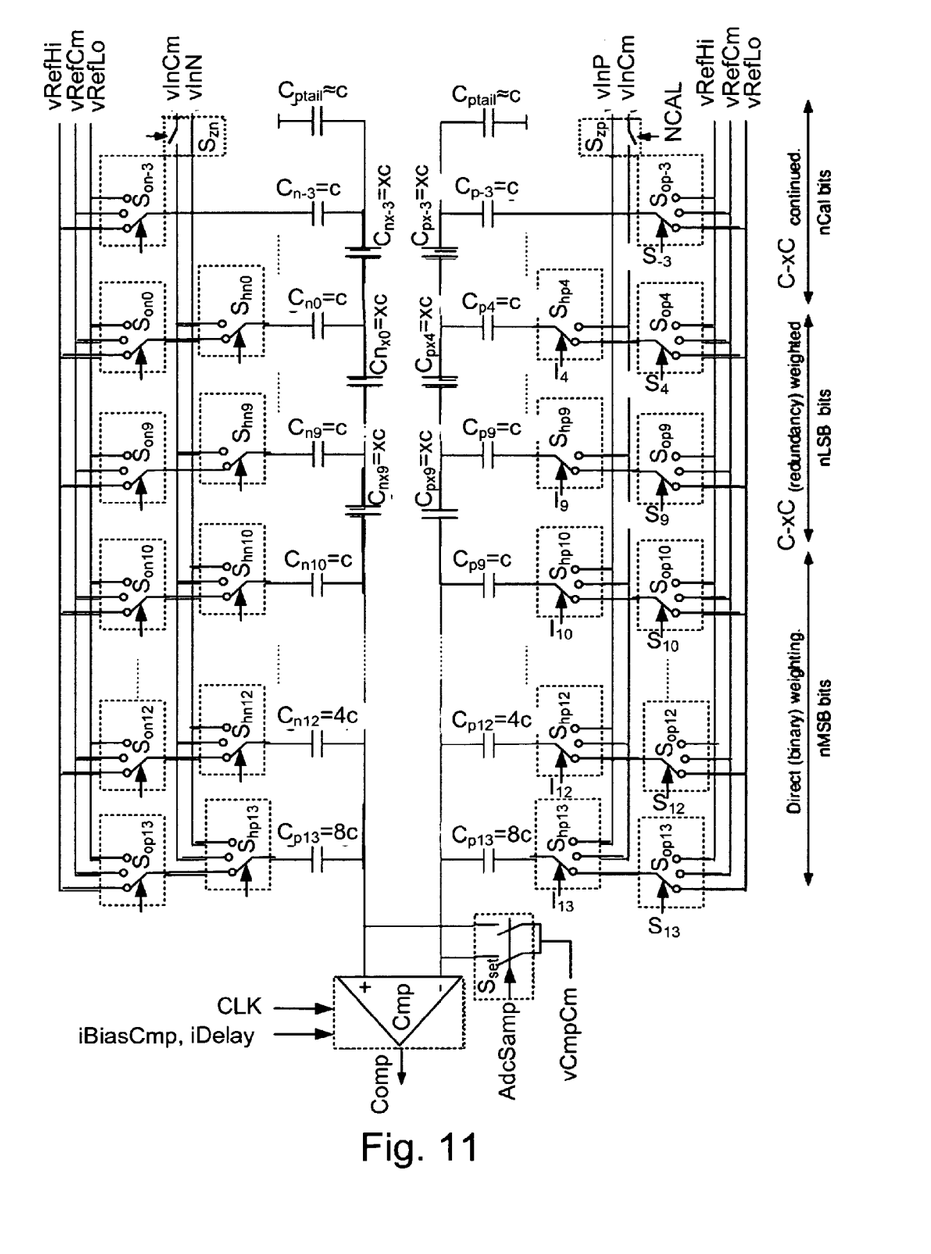
FIG. 11 is a block diagram of an ADC.

In practice, this switching to a floating node may only require the addition of one switch per differential branch of the ADC by using the available switches to vInCm (input voltage common mode) bias voltage and commonly break the connection to the vInCm bias voltage by the $S_{zx}$ switch (x=n or p) as suggested in FIG. 11. Initially this node should be charged to for example vInCm or vRefHi (high level reference voltage) at the beginning of each weight sampling so that no PN-junctions at the floating node can become forward biased due to bad initial conditions which would ruin the approximation process.

Above, relatively detailed embodiments of the present invention have been described. Below follows a more generalized description of some embodiments of the present invention.

According to some embodiments of the present invention, a method of determining at least one calibration value for a redundant ADC is provided. The redundancy results in that, for at least an i:th bit $b_i$, the corresponding bit weight $w_i$ is less than the sum of the bit weights $w_j$, $j=0, 1, \ldots, i-1$ corresponding to the bits $b_j$, $j=0, 1, \ldots, i-1$ with lesser significance than the bit $b_i$, whereby estimation of the bit weight $w_i$ in terms of said bit weights $w_j$ is made possible. According to embodiments, the method comprises sampling a first electrical value representative of the bit weight $w_i$. Furthermore, according to embodiments, the method comprises performing a first A/D conversion using the bits $b_j$, $j=0, 1, \ldots, i-1$ with lesser significance than the bit $b_i$ to obtain a first digital word of said bits $b_j$, $j=0, 1, \ldots, i-1$ with lesser significance than the bit $b_i$ representing said first electrical value. Moreover, the method comprises estimating the value of the bit weight $w_i$ expressed in terms of the bit weights $j=0, 1, \ldots, i-1$ corresponding to the bits $b_j$, $j=0, 1, \ldots, i-1$ with lesser significance than the bit $b_i$ based at least on said first digital word. The resulting estimated value of the bit weight $w_i$ is one of the at least one calibration value.

As indicated by embodiments above, in order to cope with non-negligible offsets, the method may further comprise sampling a second electrical value representative of the sum of one or more bit weights $w_k$ corresponding to one or more bits $b_k$ with lesser significance than the bit $b_i$. A second A/D conversion may be performed using the bits $b_j$, $j=0, 1, \ldots, i-1$ with lesser significance than the bit $b_i$ to obtain a second digital word of said bits $b_j$, $j=0, 1, \ldots, i-1$ with lesser significance than the bit $b_i$ representing said second electrical value. The value of the bit weight $w_i$ expressed in terms of the bit weights $w_j$, $j=0, 1, \ldots, i-1$ corresponding to the bits $b_j$, $j=0, 1, \ldots, i-1$ with lesser significance than the bit $b_i$ may be estimated based on the first and the second digital word, e.g. as indicated by Eq. 29.

Furthermore, as is also indicated above to cope with non-negligible offsets, performing the first and the second A/D conversion may comprise performing a first level shift with a first amount and a second level shift with a second amount, respectively, for ensuring that the electrical value to be converted is in a conversion range corresponding to the bits $b_j$, $j=0, 1, \ldots, i-1$ with lesser significance than the bit $b_i$ even in the presence of an offset. In the embodiment described above, the first and second amounts are equal (the amount in both cases is $w_s$). However, different amounts may be used in the first and the second A/D conversion. As indicated above, the first and the second amount may (but does not necessarily) correspond to approximately half the bit weight $w_i$.

Although this is not shown in the embodiments above, the offset $v_{os}$ may be extracted from Eq. 25-26 and used as a calibration value. Thus, some embodiments of the method may generally comprise estimating a value of an offset of the ADC based on the first and the second digital word. Said estimated value of the offset may be one of said at least one calibration value.

The estimated value of the bit weight $w_i$ may, in some embodiments, be the result of a single iteration of the above-described estimation process of sampling the first electrical value representative of the bit weight $w_i$ followed by said first A/D conversion (and possibly also including sampling a second electrical value representative of the sum of one or more bit weights $w_k$ corresponding to one or more bits $b_k$ with lesser significance than the bit $b_i$ followed by said second A/D conversion). However, in some embodiments, said estimation process may be iterated several times, resulting in a plurality of intermediate estimates of the bit weight $w_i$ (and, possibly in a plurality of intermediate estimated values of the offset). The final estimated value of the bit weight $w_i$ may be generated based on the plurality of intermediate estimates of the bit weight $w_i$, e.g. as an average value of the plurality of intermediate estimates of the bit weight $w_i$. (And, in a similar way, the final estimated value of the offset may be generated based on the plurality of intermediate estimates of the offset, e.g. as an average value of the plurality of intermediate estimates of the offset.) Generating the estimated value of the bit weight $w_i$ (and, possibly, the estimated value of the offset) based on several iterations in such a way has the advantage that the influence of measurement noise and/or interference can be reduced.

Furthermore, according to some embodiments of the present invention, a method of calibrating such a redundant ADC is provided. Embodiments of this method comprises, for each of one or more such bits $b_i$ for which the corresponding bit weight $w_i$ is less than the sum of the bit weights $w_j$, $j=0, 1, \ldots, i-1$ corresponding to the bits $b_j$, $j=0, 1, \ldots, i-1$ with lesser significance than the bit $b_i$, performing the following steps:

a) performing an embodiment of the above-described method of determining at least one calibration value for estimating the value of the bit weight $w_i$ expressed in terms of the bit weights $w_j$, $j=0, 1, \ldots, i-1$ corresponding to the bits $b_j$, $j=0, 1, \ldots, i-1$ with lesser significance than the bit $b_i$; and b) storing said at least one or more calibration values, resulting from step a) in a memory.

Moreover, according to some embodiments of the present invention, a method of error correction in such a redundant ADC is provided. Embodiments of this method comprises calibrating the ADC using an embodiment of the method of calibrating such a redundant ADC described above. Furthermore, the method comprises, during operation of the ADC for A/D conversion of an analog input signal of the ADC, utilizing the stored one or more calibration values for determining an error-corrected output signal of the ADC. For example, according to some embodiments, the bit weights that have not been estimated (e.g. the L LSBs discussed above) are assumed, for the purpose of generating the error-corrected output signal, to have their nominal values they have been designed for, for example expressed as a multiple of a unit weight $w_{unit}$ (which may in turn be the same as the LSB weight $w_0$). It can thus be concluded that the value of each bit weight can be expressed as $w_i = k_i w_{unit}$, where the proportionality factor $k_i$ is either derived from an estimated value of $w_i$ expressed in terms of the bit weights corresponding to bits with lower significance, if such an estimated value is available from the calibration, or otherwise is taken as the nominal value. The error corrected digital signal can then e.g. be generated by multiplying each bit of the uncorrected output signal of the ADC with the respective value of $k_i$, and then generate the sum (over all bits) of all the thereby generated products.

According to some embodiments, a control unit for such a redundant ADC is provided. In these embodiments, the control unit is configured to control the execution of one or more of any of the embodiments of any of the methods described above. According to further embodiments, a redundant ADC as described above comprising such a control unit is provided.

According to some embodiments, several such redundant ADCs may be combined in a time interleaved fashion to form a time interleaved ADC. The concept of time interleaving of ADCs as such is known and is not further described herein.

In any of the embodiments described above, the redundant ADC may be any type of ADC having such redundancy, such as an SA ADC or a pipeline ADC having such redundancy.

The above mentioned control unit may be implemented as an application-specific hardware unit. Alternatively, said control unit, or parts thereof, may be implemented using one or more configurable or programmable hardware units, such as but not limited to one or more field-programmable gate arrays (FPGAs), processors, or microcontrollers. Hence, embodiments of the present invention may be embedded in a computer program product, which enables implementation of the methods and functions described herein. Therefore, according to embodiments of the present invention, there is provided a computer program product, comprising instructions arranged to cause said programmable control unit of the redundant ADC to perform the steps of any of the embodiments of the methods described herein. The computer program product may comprise program code which is stored on a computer readable medium which can be loaded and executed by said programmable control unit of the redundant ADC, to cause it to perform the steps of any of the embodiments of the methods described herein.

The present invention has been described above with reference to specific embodiments. However, other embodiments than the above described are possible within the scope of the invention. Different method steps than those described above, performing the method or methods by hardware or software, may be provided within the scope of the invention. The different features and steps of the embodiments may be combined in other combinations than those described.

The invention claimed is:

1. A method of determining at least one calibration value for a redundant analog-to-digital-converter, ADC, comprising taps of a capacitive network wherein, for at least an i:th bit $b_i$, the corresponding bit weight $w_i$ is less than the sum of the bit weights $w_j$, $j=0,1,\ldots,i-1$ corresponding to the bits $b_j$, $j=0,1,\ldots,i-1$ with lesser significance than the bit $b_i$, comprising:
for taps corresponding to bits with higher significance than the bit $b_i$:
connecting each tap to a different floating node; or
connecting all taps to the same floating node;
sampling a first electrical value representative of the bit weight $w_i$; and
performing a first analog-to-digital, A/D, conversion using the bits $b_j$, $j=0,1,\ldots,i-1$ with lesser significance than the bit $b_i$ to obtain a first digital word of said bits $b_j$, $j=0,1,\ldots,i-1$ with lesser significance than the bit $b_i$ representing said first electrical value;
estimating the value of the bit weight $w_i$ expressed in terms of the bit weights $w_j$, $j=0,1,\ldots,i-1$ corresponding to the bits $b_j$, $j=0,1,\ldots,i-1$ with lesser significance than the bit $b_i$ based at least on said first digital word, wherein the resulting estimated value of the bit weight $w_i$ is one of the at least one calibration value.

2. The method according to claim 1, further comprising sampling a second electrical value representative of the sum of one or more bit weights $w_k$ corresponding to one or more bits $b_k$ with lesser significance than the bit $b_i$; and
performing a second A/D conversion using the bits $b_j$, $j=0,1,\ldots,i-1$ with lesser significance than the bit $b_i$ to obtain a second digital word of said bits $b_j$, $j=0,1,\ldots,i-1$ with lesser significance than the bit $b_i$ representing said second electrical value; wherein
estimating the value of the bit weight $w_i$ expressed in terms of the bit weights $w_j$, $j=0,1,\ldots,i-1$ corresponding to the bits $b_j$, $j=0,1,\ldots,i-1$ with lesser significance than the bit $b_i$ comprises estimating said value of the bit weight $w_i$ based on the first and the second digital word.

3. The method according to claim 2, wherein performing the first and the second A/D conversion comprises performing a first level shift with a first amount and a second level shift with a second amount, respectively, for ensuring that the electrical value to be converted is in a conversion range corresponding to the bits $b_j$, $j=0,1,\ldots,i-1$ with lesser significance than the bit $b_i$ even in the presence of an offset.

4. The method according to claim 3, wherein the first amount is equal, or substantially equal, to the second amount.

5. The method according to claim 4, wherein the first and second amount correspond to approximately half the bit weight $w_i$.

6. The method according to claim 3, further comprising estimating a value of an offset of the ADC based on the first and the second digital word.

7. The method according to claim 6, wherein the estimated value of the offset is one of said at least one calibration value.

8. A method of determining at least one calibration value for a redundant analog-to-digital-converter, ADC, comprising N taps of a capacitive network wherein, for at least an i:th bit $b_i$, the corresponding bit weight $w_i$ is less than the sum of the bit weights $w_j$, $j=0,1,\ldots,i-1$ corresponding to the bits $b_j$, $j=0,1,\ldots,i-1$ with lesser significance than the bit $b_i$, and wherein a relation $r_k$, $k=1,\ldots,N-1$, between the bit weights $w_k$, $k=0,1,\ldots,N-1$, is expressed by $w_k = w_{k-1} r_k$, the method comprising:
performing the method according to claim 1 for $i=L-1$ wherein estimating the value of the bit weight $w_{L-1}$ expressed in terms of the bit weights $w_j$, $j=0,1,\ldots,L-2$ produces $a_{L-1,j}$ that fulfill $$w_{L-1} = \sum_{j=0}^{L-2} a_{L-1,j} \cdot w_j;$$

numerically solving $$r^{L-1} \cdot w_0 = \sum_{j=0}^{L-2} a_{L-1,j} \cdot r^j \cdot w_0$$

using successive approximation; and
using an assumption that $r_k = r$, $k=1,\ldots,L-1$ for remaining bits $b_i$, $i>L-1$.

9. A method of calibrating a redundant ADC, wherein, for at least an i:th bit $b_i$, the corresponding bit weight $w_i$ is less than the sum of the bit weights $w_j$, $j=0,1,\ldots,i-1$ corresponding to the bits $b_j$, $j=0,1,\ldots,i-1$ with lesser significance than the bit $b_i$, comprising
for each of one or more such bits $b_i$:
a) performing the method according to claim 1 for estimating the value of the bit weight $w_i$ expressed in terms of the bit weights $w_j$, $j=0,1,\ldots,i-1$ corresponding to the bits $b_j$, $j=0,1,\ldots,i-1$ with lesser significance than the bit $b_i$; and
b) storing said at least one or more calibration values, resulting from step a) in a memory.

10. A method of error correction in a redundant ADC, wherein, for at least an i:th bit $b_i$, the corresponding bit weight $w_i$ is less than the sum of the bit weights $w_j$, $j=0,1,\ldots,i-1$ corresponding to the bits $b_j$, $j=0,1,\ldots,i-1$ with lesser significance than the bit $b_i$ comprising calibrating the ADC using the method according to claim 9; and during operation of the ADC for A/D conversion of an analog input signal of the ADC, utilizing the stored one or more calibration values for determining an error-corrected output signal of the ADC.

11. The method according to claim 1, wherein the ADC is a successive approximation, SA, ADC.

12. The method according to claim 1, wherein the ADC is a pipeline ADC.

13. A control unit for a redundant ADC, wherein, for at least an i:th bit $b_i$, the corresponding bit weight $w_i$ is less than the sum of the bit weights $w_j$, j=0,1, ..., i−1 corresponding to the bits $b_j$, j=0,1, ..., i−1 with lesser significance than the bit $b_i$, wherein the control unit is configured to control the execution of the method according to claim 1.

14. The control unit according to claim 13, wherein the ADC is an SA ADC.

15. The control unit according to claim 13, wherein the ADC is a pipeline ADC.

16. A redundant ADC, wherein, for at least an i:th bit $b_i$, the corresponding bit weight $w_i$ is less than the sum of the bit weights $w_j$, j=0,1, ..., i−1 corresponding to the bits $b_j$, j=0,1, ..., i−1 with lesser significance than the bit $b_i$, comprising a control unit according to claim 13.

17. The redundant ADC according to claim 16, wherein the ADC is an SA ADC.

18. The redundant ADC according to claim 16, wherein the ADC is a pipeline ADC.

19. A computer program product comprising computer program code means for executing the method according to claim 1 in the redundant ADC when said computer program code means are run by a programmable control unit of the redundant ADC.

20. A computer readable medium having stored thereon a computer program product according to claim 19.

* * * * *